United States Patent [19]

Miyakawa et al.

[11] 4,210,864

[45] Jul. 1, 1980

[54] APPARATUS FOR SENSING TONER DENSITY USING A STATIONARY FERROMAGNETIC MASS WITHIN THE TONER TO INCREASE SENSITIVITY

[75] Inventors: Seiichi Miyakawa; Susumu Tatsumi; Koji Sakamoto; Yoshihiro Ogata, all of Tokyo, Japan

[73] Assignee: Ricoh Company, Ltd., Tokyo, Japan

[21] Appl. No.: 897,466

[22] Filed: Apr. 18, 1978

[30] Foreign Application Priority Data

Apr. 19, 1977 [JP] Japan ........................ 52-44925

[51] Int. Cl.$^2$ ........................ G01R 33/00; G01N 9/00

[52] U.S. Cl. ........................ 324/204; 324/236; 222/DIG. 1; 222/57; 118/689; 118/712; 355/3 DD

[58] Field of Search ........................ 222/DIG. 1, 57; 340/195; 118/7, 9, 10, 646; 324/204, 234, 236; 355/3 DD

[56] References Cited

U.S. PATENT DOCUMENTS 3,572,551 3/1971 Gillespie et al. ........................ 118/7

3,802,381 4/1974 O'Niell et al. ........................ 118/7

*Primary Examiner*—Robert J. Corcoran

*Assistant Examiner*—Walter E. Snow

*Attorney, Agent, or Firm*—Frank J. Jordan

[57] ABSTRACT

A powdered toner mixture comprising a non-magnetic toner component and a ferromagnetic carrier component is caused to flow downwardly through a vertical conduit by gravity. An electromagnetic coil is wound around the conduit and energized with an alternating electric signal. An electrically conductive and magnetic mass is disposed inside the conduit. The permeability of the toner mixture decreases as the toner density, or the ratio of the toner component to the carrier component, increases. The lower the permeability of the toner mixture, the greater the proportion of magnetic flux passing through the mass. The flux passing through the mass induces eddy currents therein which, in combination with hysterisis and skin effect losses, dissipate a portion of the electric signal. The amount of power dissipation is a function of the relative proportion of flux through the mass and thereby the toner density and, when measured, provides a measure of the toner density.

7 Claims, 6 Drawing Figures

APPARATUS FOR SENSING TONER DENSITY USING A STATIONARY FERROMAGNETIC MASS WITHIN THE TONER TO INCREASE SENSITIVITY

BACKGROUND OF THE INVENTION

The present invention relates to a toner density sensing apparatus for an electrostatic copying machine or the like.

A toner or developing substance for a dry process electrostatic copying machine comprises ferromagnetic carrier particles and non-magnetic, black colored toner particles. The toner particles adhere to the carrier particles due to frictional electrostatic force. The toner mixture is applied to a photoconductive drum on which an electrostatic image of an original document is formed by means of a magnetic brush which adheres the toner mixture thereto by means of magnetic attraction of the carrier particles.

The toner particles are attracted from the magnetic brush to areas of high electrostatic charge on the drum to develop the electrostatic image into a toner image which is transferred and fixed to a copy sheet to provide a permanent reproduction of the original document corresponding to the electrostatic image.

Whereas the toner component is progressively consumed in the developing process, the carrier component is not. Thus, the toner density, or the ratio of the toner component to the carrier component in the toner mixture, progressively decreases during the developing process. It is necessary to periodically replace the consumed toner particles and maintain the toner density substantially constant. Excessive toner density causes gray background areas on finished copies. Low toner density results in copies of insufficient image density. The acceptable range of toner density is quite narrow. For this reason, it is necessary to provide accurate means for measuring or sensing the toner density and replenishing the toner component when necessary.

A known method of sensing toner density involves causing the toner mixture to fall through a vertical conduit. An electromagnetic coil is wound around the conduit and energized with an alternating electric signal. The toner mixture in the conduit effectively constitutes a core of the coil. The permeability of the toner mixture and the inductance of the coil increase as the toner density decreases. The inductance reactance of the coil to the alternating electric signal thereby constitutes a measure of the toner density. The coil may be connected in the tank circuit of an oscillator in such a manner that the frequency of the oscillator varies in accordance with the inductance of the coil and thereby the toner density.

Although this type of toner density sensing apparatus is effective in theory, it does not provide satisfactory performance in actual practice. The reason for this is that the variation of inductance of the coil for a given change in toner density is quite small. Measuring apparatus with sufficient sensitivity to detect such small changes in inductance is complicated in construction and expensive to manufacture. Even where such sensitive measuring apparatus is provided, the accuracy of toner density sensing is unreliable.

SUMMARY OF THE INVENTION

The present invention overcomes the drawbacks of the prior art by providing a coil wound around a conduit through which toner mixture is caused to flow downwardly by gravity, an electrically conductive mass disposed in the conduit, means for applying an alternating electric signal to the coil and means for measuring the power dissipation of the electric signal. The lower the toner density, the greater the proportion of magnetic flux passing through the mass and the greater the power dissipation therein due to eddy currents, skin effect, hysterisis and other factors.

It is an object of the present invention to provide a toner density sensing apparatus of sufficient accuracy for practical application.

It is another object of the present invention to provide a novel method of toner density measurement.

It is another object of the present invention to provide a toner density sensing apparatus which is simple in construction and inexpensive to manufacture on a commercial production basis.

It is another object of the present invention to provide a generally improved toner density sensing apparatus for an electrostatic copying machine.

Other objects, together with the foregoing, are attained in the embodiments described in the following description and illustrated in the accompanying drawing.

DESCRIPTION OF THE PREFERRED EMBODIMENTS

While the toner density sensing apparatus of the invention is susceptible of numerous physical embodiments, depending upon the environment and requirements of use, substantial numbers of the herein shown and described embodiments have been made, tested and used, and all have performed in an eminently satisfactory manner.

Figure 1:
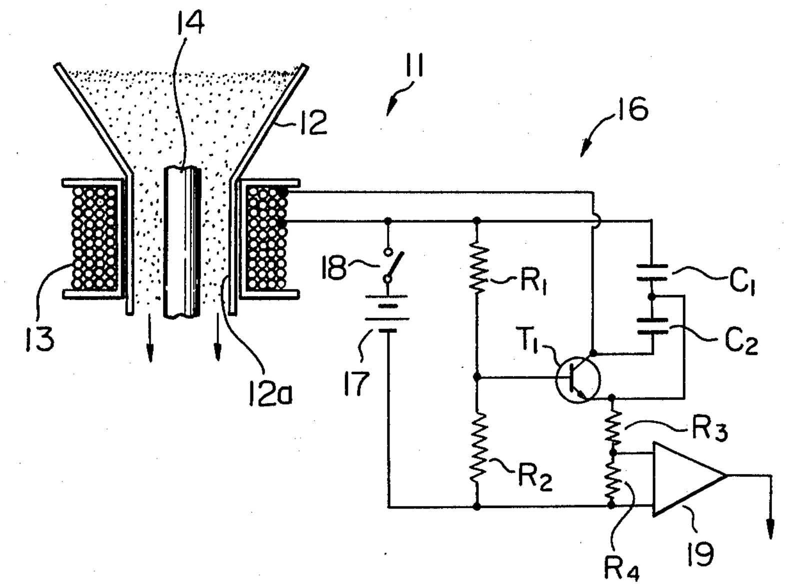
FIG. 1 is a schematic view of a toner density sensing apparatus embodying the present invention.

Referring now to FIG. 1 of the drawing, a toner density sensing apparatus embodying the present invention is generally designated by the reference numeral 11 and comprises a funnel 12 made of an electrically insulative material. The lower portion of the funnel 12 constitutes a vertical tubular conduit and is designated as **12*a*. An electromagnetic coil 13 is wound around the conduit 12*a*. A rod 14 made of an electrically conductive and magnetic material is provided in the conduit 12*a* coaxially within the coil 13 and supported by a suitable means, although not shown. A toner mixture comprising non-magnetic toner particles and ferromagnetic carrier particles is introduced into the top of the funnel 12 and caused to flow downwardly by gravity through the conduit 12*a* around the rod 14**, although not shown.

The coil 13 is connected in the tank circuit of a Colpitts oscillator 16 which comprises an NPN transistor T1. A voltage divider comprising resistors R1 and R2 is connected between the positive terminal of a battery 17 and provides a fixed bias for the base of the transistor T1. A switch 18 is connected between the battery 17 and the resistor R1. Emitter resistors R3 and R4 are connected between the emitter of the transistor T1 and ground. An amplifier 19 is connected across the resistor R4. A parallel resonant circuit is connected between the collector of the transistor T1 and the battery 17 consisting of the coil 13 and two capacitors C1 and C2 connected in series. Feedback is provided by tapping the junction of the capacitors C1 and C2 and connecting the same to the emitter of the transistor T1. The oscillator 16 is designed to oscillate at a frequency of several hundred kilohertz.

The frequency fo of the oscillator 16 is equal to $$fo = \frac{1}{2\pi}\sqrt{\frac{C_1 + C_2}{LC_1C_2}} \quad (1)$$

where L is the inductance of the coil 13 and $C_1$ and $C_2$ are the capacitances of the capacitors C1 and C2 respectively. Thus, the frequency fo of the oscillator 16 depends on L where $C_1$ and $C_2$ are fixed. The inductance L of the coil 13 is equal to $$L = \mu K N^2 \quad (2)$$

where N is the number of turns of the coil 13, K is a constant and $\mu$ is the permeability of the toner mixture in combination with the rod 14 inside the conduit 12*a*. In a prior art apparatus which does not comprise the rod 14, the variation of fo as a function of the toner density is quite small.

Figure 2:
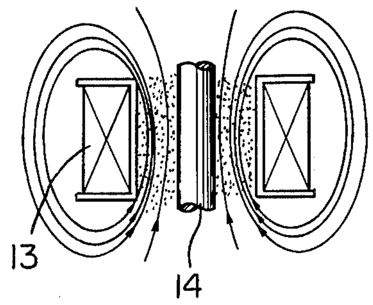
FIG. 2 is a diagram illustrating the operation of the apparatus for low toner density.
Figure 3:
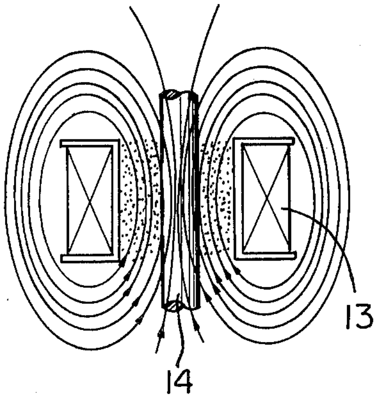
FIG. 3 is a diagram illustrating the operation of the apparatus for high toner density.

FIGS. 2 and 3 illustrate a basis principle of the present invention. FIG. 2 shows the magnetic flux lines where the toner density is low and FIG. 3 shows the magnetic flux lines where the toner density is high. The magnetic flux lines produced by the alternating current flow through the coil 13, and represent typical instantaneous values.

It will be noted that in FIG. 2, due to the high permeability of toner mixture, a greater proportion of the flux lines pass through the toner mixture than in FIG. 3. In FIG. 3, the high toner density mixture has low permeability and a greater proportion of the flux lines pass through the rod 14 than in FIG. 2.

The flux density $\Phi$ depends on the magnetic field intensity B and the permeability $\mu$ as follows $$\Phi = \int \mu B ds \quad (3)$$

where S is the cross-sectional area of the coil 16. In practical application, the magnetic field intensity and the total flux do not vary substantially in response to variations in toner density. However, the distribution of flux does vary. The greater the toner density and the lower the permeability of the toner mixture, the greater the proportion of flux which passes through the rod 14 in accordance with equation (3).

Whereas electromagnetically induced current flow through the toner mixture is negligible, the rod 14 is electrically conductive and may also be magnetic. Thus, circulating eddy currents are induced in the rod 14 in accordance with Maxwell's equation as follows $$\mathrm{Curl}\vec{E} = \nabla \times \vec{E} = -\frac{\partial \vec{B}}{\partial t} \quad (4)$$

These eddy currents cause power dissipation in the rod 14 through conversion of electrical current into heat. Magnetic hysterisis and skin effect losses cause further power dissipation. In accordance with an important principle of the present invention, the power dissipation is a function of the toner density. The higher the toner density, the greater the proportion of magnetic flux passing through the rod 14 and the greater the power dissipation. The amount of dissipation of the alternating electric signal produced by the oscillator may be measured in any convenient manner. As illustrated, the amplifier 19 produces an output proportional to the magnitude of the electrical signal, which corresponds to the toner density. In addition, it is to be noted that a stable oscillation of the oscillator is maintained by a positive feedback and that a small change in the amount of the feedback causes a large change in an output of the oscillator. Thus, the present invention utilizes such a characteristics of the oscillator.

Through optimal selection of the material and dimensions of the rod 14, a large change in power dissipation may be produced by a small change in toner density. The properties of the rod 14 depend on the particular toner density range which is to be maintained. It is further possible to obtain a sharp variation in the output voltage of the amplifier 19 at a particular value of toner density.

In particular application, it is sufficient to determine when a lower limit of toner density has been reached. Since the amount of carrier particles in the toner mixture remains constant, once the lower limit of toner density has been detected an upper limit of toner density may be attained by adding a predetermined amount of toner particles to the toner mixture. Thus, the apparatus 11 may be connected to actuate a toner dispenser (not shown) to add a predetermined amount of toner particles when the lower limit is detected. In this manner, the toner density is maintained between predetermined lower and upper limits.

Figure 4:
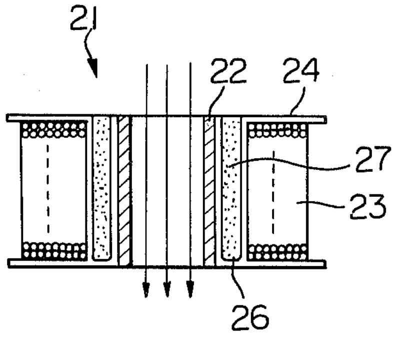
FIG. 4 is a sectional view of a second embodiment of the present invention.

FIG. 4 illustrates a coil assembly 21 comprising a hollow non-magnetic vertical conduit 22 through which the toner mixture is caused to flow downwardly. Although the conduit 22 is non-magnetic, it is electrically conductive and made of metal or the like. An electrically insulative and non-magnetic bobbin 24 is securely fit around the conduit 22. An electromagnetic coil 23 is wound around the bobbin 24. An annular chamber 26 is formed in the bobbin 24 which is filled with a magnetic mass 27. The mass 27 may be in solid form, or as illustrated may be constituted by a toner mixture of a predetermined toner density. The higher the toner density of toner mixture flowing through the conduit 22, the smaller the proportion of flux passing through the toner mixture and the greater the power dissipation in the wall of the conduit 22.

Figure 5:
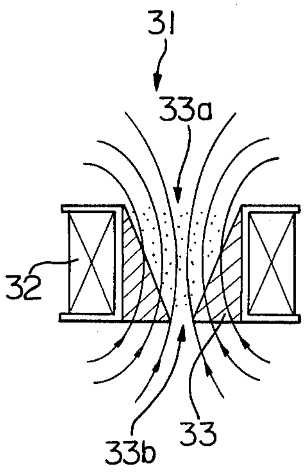
FIG. 5 is a sectional view of a third embodiment of the present invention.

FIG. 5 illustrates another coil assembly 31 which comprises a coil 32 in which is fit an electrically conductive, magnetic member 33. The member 33 is formed with a bore 33*a* which decreases in diameter in the downward direction. The toner mixture is caused to flow downwardly through the bore 33*a*. The lower end of the bore 33*a* is designated as 33*b* and constitutes a constriction to decrease the flow rate of toner mixture through the member 33.

Figure 6:
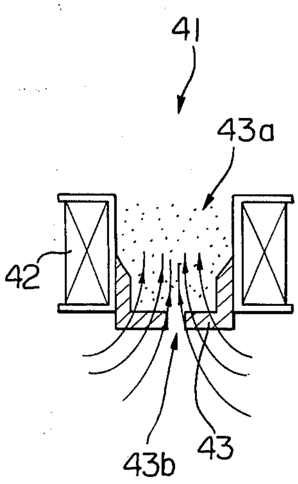
FIG. 6 is a sectional view of a fourth embodiment of the present invention.

FIG. 6 illustrates another coil assembly 41 comprising a coil 42 in which is fit an electrically conductive, magnetic member 43 formed with a bore 43a. The lower end of the bore 43a also constitutes a constriction. However, the cross section of the bore 33a is reduced at the lower end thereof in a stepwise rather than tapering manner.

EXAMPLE

An electromagnetic coil was formed by winding a conductive wire having a diameter of 0.5 mm around a tubular resinous bobbin having an inner diameter of 10 mm. The length of the bobbin was 7 mm, and the number of turns of the wire was 280. The coil was installed in a Colpitts oscillator circuit adapted to produce a resonant frequency of 350 KHz. The oscillator was powered by a 24 VDC source.

An electrically conductive and magnetic core or rod was centered in the coil both axially and coaxially. The rod was 3 mm in diameter, 40 mm long and made of wrought iron. Where toner mixture having a toner density of 1.0% by weight was passed through the coil, the oscillator output voltage was 10.6 VAC. When the toner density was increased to 1.5 % by weight, the oscillator output voltage decreased to 9.3 VAC. Thus, a change of 0.5% in toner density produced a change of 1.3 VAC in oscillator output voltage. Such a change can be easily sensed and processed by a simple and inexpensive measuring apparatus.

In addition to the voltage change, the frequency of oscillation also changed by about 5 KHz.

In summary, it will be seen that the present invention overcomes the drawbacks of the prior art by providing a coil assembly which produces a large change in power dissipation for a small change in toner density. The present apparatus is accurate, but simple and inexpensive.

Various modifications will become possible for those skilled in the art after receiving the teachings of the present disclosure without departing from the scope thereof. For example, the electrically conductive mass may be designed to reduce the oscillator output voltage to zero at a particular value of toner density, thereby allowing automatic on-off control of a toner replenishment device. For example, the replenishment device may be turned off when the upper limit of toner density is reached. This phenomenon is facilitated by providing a magnetic shield such as made of ferrite to the coil. As another modification, the conduit 22 of FIG. 4 may be omitted, and the radially inner portion of the bobbin 24 defining the chamber 26 made of an electrically conductive material.

What is claimed is:

1. An apparatus for sensing a toner density of a powdered toner mixture including a non-magnetic toner component and a ferromagnetic carrier component, the toner density being constituted by a ratio of the toner component to the carrier component, the apparatus comprising:

container means for containing the toner mixture;

an electromagnetic coil wound around the container means;

an electrically conductive ferromagnetic mass provided in the container, said mass comprising a powdered ferromagnetic substance provided inside an annual chamber formed in the container said chamber being distinct from that portion of the container carrying the toner to be sensed;

power source means for applying an alternating electric signal to the coil; and sensor means for sensing an amount of dissipation of the electrical signal.

2. An apparatus as in claim 1, in which the ferromagnetic substance comprises toner mixture of a predetermined toner density.

3. An apparatus for sensing a toner density of a powdered toner mixture including a non-magnetic toner component and a ferromagnetic carrier component, the toner density being constituted by a ratio of the toner component to the carrier component, the apparatus comprising:

container means for containing the toner mixture, said container means being disposed to have toner mixture pass therethrough such that the toner density of different portions of the toner mixture may be sensed in passing through the container means;

an electromagnetic coil wound around the outside of said container means;

a stationary electrically conductive mass provided in the container means;

power source means for applying an alternating electric signal to the coil; and sensor means for sensing an amount of dissipation of the electric signal, said stationary mass being constructed and arranged such that the flux passing through the stationary mass results in power dissipation of the electric signal in the stationary mass through conversion into heat such that the sensitivity to detect small changes in toner density is enhanced in that a relatively small change in toner density will result in a relatively large change in power dissipation.

4. An apparatus as in claim 3 in which said stationary mass is an elongated solid member disposed in said container means.

5. An apparatus as in claim 4 in which said container means has an axis along which said toner mixture passes, said elongated member being coaxially disposed in said container means.

6. An apparatus as in claim 5 wherein the elongated member is disposed so that the toner mixture passes between the elongated member and the container means.

7. The method of increasing the sensitivity of determining the toner density of a powdered toner mixture including a non-magnetic toner component and a ferromagnetic carrier component, the toner density being constituted by a ratio of the toner component to the carrier component, the method comprising:

passing a toner mixture in a container having an electromagnetic coil therearound;

applying an electric signal to the coil;

sensing the amount of dissipation of the electric signal; and dissipating power of the electric signal by providing a stationary electrically conductive mass in the container to thereby increase the sensitivity of determining the toner density of the powdered toner in that a relatively small change in toner density will result in a relatively large change in power dissipation.

* * * * *